US010079048B2

(12) United States Patent
Syu (10) Patent No.: US 10,079,048 B2
(45) Date of Patent: Sep. 18, 2018

(54) ADJUSTING ACCESS OF NON-VOLATILE SEMICONDUCTOR MEMORY BASED ON ACCESS TIME

(75) Inventor: Mei-Man L. Syu, Fremont, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 12/410,304

(22) Filed: Mar. 24, 2009

(65) Prior Publication Data

US 2010/0250793 A1    Sep. 30, 2010

(51) Int. Cl.
| | |
|---|---|
| G06F 9/00 | (2006.01) |
| G11C 7/22 | (2006.01) |
| G11C 16/32 | (2006.01) |
| G06F 12/02 | (2006.01) |

(52) U.S. Cl.
CPC ............ *G11C 7/22* (2013.01); *G06F 12/0246* (2013.01); *G11C 16/32* (2013.01); *G06F 2212/7201* (2013.01); *G11C 2216/30* (2013.01)

(58) Field of Classification Search
CPC ......... G06F 12/0246; G06F 2212/7201; G11C 7/22; G11C 16/32; G11C 2216/30
See application file for complete search history.

(56) References Cited

U.S. PATENT DOCUMENTS

| | | |
|---|---|---|
| 4,644,494 A | 2/1987 | Muller |
| 4,937,736 A | 6/1990 | Chang et al. |
| 5,018,096 A | 5/1991 | Aoyama |
| 5,640,529 A | 6/1997 | Hasbun |
| 5,768,189 A | 6/1998 | Takahashi |
| 5,781,783 A | 7/1998 | Gunther et al. |
| 5,860,137 A | 1/1999 | Raz et al. |
| 5,929,590 A | 7/1999 | Tang |
| 6,052,799 A | 4/2000 | Li et al. |
| 6,134,631 A | 10/2000 | Jennings, III |
| 6,173,360 B1 | 1/2001 | Beardsley et al. |
| 6,286,087 B1 | 9/2001 | Ito et al. |

(Continued)

FOREIGN PATENT DOCUMENTS

| | | |
|---|---|---|
| CN | 1662886 A | 8/2005 |
| CN | 1761935 A | 4/2006 |
| CN | 1985239 A | 6/2007 |

OTHER PUBLICATIONS

MICRON Technical Note, "NAND Flash 101: An Introduction to NAND Flash and How to Design it in to Your Next Product", TN-29-19, Nov. 2006, http://download.micron.com/pdf/technotes/nand/tn2919.pdf, pp. 1-28.

(Continued)

*Primary Examiner* — Hyun Nam
*Assistant Examiner* — Dean Phan
(74) *Attorney, Agent, or Firm* — McDermott Will & Emery LLP (57) ABSTRACT

A non-volatile semiconductor memory is disclosed comprising a first memory device and control circuitry operable to issue an access command to the first memory device. A command status is requested from the first memory device after a status delay. When the command status indicates the first memory device has completed the command, a first access time of the memory device is measured. An access sequence of the first memory device is then modified in response to the access time.

12 Claims, 6 Drawing Sheets

(56) References Cited

U.S. PATENT DOCUMENTS

| | | | |
|---|---|---|---|
| 6,324,627 B1 | 11/2001 | Kricheff et al. | |
| 6,484,229 B1 | 11/2002 | Ichikawa et al. | |
| 6,633,963 B1 | 10/2003 | Ellison et al. | |
| 6,640,268 B1* | 10/2003 | Kumar | 710/46 |
| 6,661,724 B1 | 12/2003 | Snyder et al. | |
| 6,694,381 B1 | 2/2004 | Lo et al. | |
| 6,792,519 B2 | 9/2004 | Constable et al. | |
| 6,856,556 B1 | 2/2005 | Hajeck | |
| 6,968,434 B2 | 11/2005 | Kamano et al. | |
| 7,003,644 B2* | 2/2006 | Heath et al. | 711/167 |
| 7,024,410 B2 | 4/2006 | Ito et al. | |
| 7,114,051 B2 | 9/2006 | Guu et al. | |
| 7,126,857 B2 | 10/2006 | Hajeck | |
| 7,139,871 B2 | 11/2006 | Mizuno | |
| 7,139,890 B2 | 11/2006 | Moran et al. | |
| 7,149,046 B1 | 12/2006 | Coker et al. | |
| 7,170,788 B1 | 1/2007 | Wan et al. | |
| 7,213,117 B2 | 5/2007 | Wakabayash et al. | |
| 7,224,604 B2 | 5/2007 | Lasser | |
| 7,287,118 B2 | 10/2007 | Chang et al. | |
| 7,307,881 B2 | 12/2007 | Chen et al. | |
| 7,315,917 B2 | 1/2008 | Bennett et al. | |
| 7,330,954 B2* | 2/2008 | Nangle | 711/170 |
| 7,408,804 B2 | 8/2008 | Hemink et al. | |
| 7,430,136 B2 | 9/2008 | Merry, Jr. et al. | |
| 7,441,067 B2 | 10/2008 | Gorobets et al. | |
| 7,447,807 B1 | 11/2008 | Merry et al. | |
| 7,450,436 B2 | 11/2008 | Salessi et al. | |
| 7,467,253 B2 | 12/2008 | Yero | |
| 7,502,256 B2 | 3/2009 | Merry, Jr. et al. | |
| 7,509,441 B1 | 3/2009 | Merry et al. | |
| 7,515,471 B2* | 4/2009 | Oh et al. | 365/185.11 |
| 7,596,643 B2 | 9/2009 | Merry, Jr. et al. | |
| 7,609,565 B2* | 10/2009 | Lee | 365/189.05 |
| 7,653,778 B2 | 1/2010 | Merry, Jr. et al. | |
| 7,654,466 B2 | 2/2010 | Maeda et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1 | 6/2010 | Walston et al. | |
| 7,765,373 B1 | 7/2010 | Merry et al. | |
| 7,898,855 B2 | 3/2011 | Merry, Jr. et al. | |
| 7,912,991 B1 | 3/2011 | Merry et al. | |
| 7,936,603 B2 | 5/2011 | Merry, Jr. et al. | |
| 7,962,792 B2 | 6/2011 | Diggs et al. | |
| 8,078,918 B2 | 12/2011 | Diggs et al. | |
| 8,090,899 B1 | 1/2012 | Syu | |
| 8,095,851 B2 | 1/2012 | Diggs et al. | |
| 8,108,692 B1 | 1/2012 | Merry et al. | |
| 8,122,185 B2 | 2/2012 | Merry, Jr. et al. | |
| 8,127,048 B1 | 2/2012 | Merry et al. | |
| 8,135,903 B1 | 3/2012 | Kan | |
| 8,151,020 B2 | 4/2012 | Merry, Jr. et al. | |
| 8,161,227 B1 | 4/2012 | Diggs et al. | |
| 8,166,245 B2 | 4/2012 | Diggs et al. | |
| 8,243,525 B1 | 8/2012 | Kan | |
| 8,254,172 B1 | 8/2012 | Kan | |
| 8,261,012 B2 | 9/2012 | Kan | |
| 8,296,625 B2 | 10/2012 | Diggs et al. | |
| 8,312,207 B2 | 11/2012 | Merry, Jr. et al. | |
| 8,316,176 B1 | 11/2012 | Phan et al. | |
| 8,341,339 B1 | 12/2012 | Boyle et al. | |
| 8,375,151 B1 | 2/2013 | Kan | |
| 8,392,635 B2 | 3/2013 | Booth et al. | |
| 8,397,107 B1 | 3/2013 | Syu et al. | |
| 8,407,449 B1 | 3/2013 | Colon et al. | |
| 8,423,722 B1 | 4/2013 | Deforest et al. | |
| 8,433,858 B1 | 4/2013 | Diggs et al. | |
| 8,443,167 B1 | 5/2013 | Fallone et al. | |
| 8,447,920 B1 | 5/2013 | Syu | |
| 8,458,435 B1 | 6/2013 | Rainey, III et al. | |
| 8,478,930 B1 | 7/2013 | Syu | |
| 8,489,854 B1 | 7/2013 | Colon et al. | |
| 8,503,237 B1 | 8/2013 | Horn | |
| 8,521,972 B1 | 8/2013 | Boyle et al. | |
| 8,549,236 B2 | 10/2013 | Diggs et al. | |
| 8,583,835 B1 | 11/2013 | Kan | |
| 8,601,311 B2 | 12/2013 | Horn | |
| 8,601,313 B1 | 12/2013 | Horn | |
| 8,612,669 B1 | 12/2013 | Syu et al. | |
| 8,612,804 B1 | 12/2013 | Kang et al. | |
| 8,615,681 B2 | 12/2013 | Horn | |
| 8,638,602 B1 | 1/2014 | Horn | |
| 8,639,872 B1 | 1/2014 | Boyle et al. | |
| 8,683,113 B2 | 3/2014 | Abasto et al. | |
| 8,700,834 B2 | 4/2014 | Horn et al. | |
| 8,700,950 B1 | 4/2014 | Syu | |
| 8,700,951 B1 | 4/2014 | Call et al. | |
| 8,706,985 B1 | 4/2014 | Boyle et al. | |
| 8,707,104 B1 | 4/2014 | Jean | |
| 8,713,066 B1 | 4/2014 | Lo et al. | |
| 8,713,357 B1 | 4/2014 | Jean et al. | |
| 8,719,531 B2 | 5/2014 | Strange et al. | |
| 8,724,422 B1 | 5/2014 | Agness et al. | |
| 8,725,931 B1 | 5/2014 | Kang | |
| 8,745,277 B2 | 6/2014 | Kan | |
| 8,751,728 B1 | 6/2014 | Syu et al. | |
| 8,769,190 B1 | 7/2014 | Syu et al. | |
| 8,769,232 B2 | 7/2014 | Suryabudi et al. | |
| 8,775,720 B1 | 7/2014 | Meyer et al. | |
| 8,782,327 B1 | 7/2014 | Kang et al. | |
| 8,788,778 B1 | 7/2014 | Boyle | |
| 8,788,779 B1 | 7/2014 | Horn | |
| 8,788,880 B1 | 7/2014 | Gosla et al. | |
| 8,793,429 B1 | 7/2014 | Call et al. | |
| 8,825,940 B1 | 9/2014 | Diggs | |
| 2002/0073272 A1 | 6/2002 | Ko et al. | |
| 2003/0110263 A1* | 6/2003 | Shillo | G06F 3/0601 709/226 |
| 2003/0149918 A1* | 8/2003 | Takaichi | 714/42 |
| 2003/0162549 A1 | 8/2003 | Carlsson | |
| 2003/0163633 A1 | 8/2003 | Aasheim et al. | |
| 2003/0182496 A1 | 9/2003 | Yoo | |
| 2003/0188092 A1 | 10/2003 | Heath et al. | |
| 2004/0015653 A1 | 1/2004 | Trantham | |
| 2005/0160195 A1 | 7/2005 | Bruner et al. | |
| 2005/0196165 A1 | 9/2005 | Dybsetter et al. | |
| 2006/0095699 A1 | 5/2006 | Kobayashi et al. | |
| 2006/0143426 A1 | 6/2006 | Wu | |
| 2006/0184736 A1 | 8/2006 | Benhase et al. | |
| 2006/0190696 A1 | 8/2006 | Ito et al. | |
| 2006/0236392 A1 | 10/2006 | Thomas et al. | |
| 2006/0294338 A1 | 12/2006 | Fisher et al. | |
| 2007/0033362 A1* | 2/2007 | Sinclair | 711/165 |
| 2007/0050536 A1 | 3/2007 | Kolokowsky | |
| 2007/0079065 A1 | 4/2007 | Bonella et al. | |
| 2007/0079097 A1 | 4/2007 | Karnowski et al. | |
| 2007/0136553 A1 | 6/2007 | Sinclair | |
| 2007/0192538 A1 | 8/2007 | Dawkins | |
| 2007/0208604 A1 | 9/2007 | Purohit et al. | |
| 2007/0233939 A1 | 10/2007 | Kim | |
| 2007/0245065 A1 | 10/2007 | Kagan et al. | |
| 2007/0247933 A1 | 10/2007 | Kagan | |
| 2008/0019189 A1 | 1/2008 | Lin | |
| 2008/0019196 A1 | 1/2008 | Lin | |
| 2008/0082726 A1 | 4/2008 | Elhamias | |
| 2008/0091872 A1 | 4/2008 | Bennett et al. | |
| 2008/0098164 A1 | 4/2008 | Lee et al. | |
| 2008/0126449 A1 | 5/2008 | Haitsma | |
| 2008/0162798 A1 | 7/2008 | Lofgren et al. | |
| 2008/0270678 A1 | 10/2008 | Cornwell et al. | |
| 2008/0282024 A1 | 11/2008 | Biswas et al. | |
| 2008/0294813 A1 | 11/2008 | Gorobets | |
| 2009/0089492 A1* | 4/2009 | Yoon et al. | 711/103 |
| 2009/0091979 A1 | 4/2009 | Shalvi | |
| 2009/0125782 A1 | 5/2009 | Josefiak et al. | |
| 2009/0138654 A1* | 5/2009 | Sutardja | 711/103 |
| 2009/0150599 A1 | 6/2009 | Bennett | |
| 2009/0172213 A1* | 7/2009 | Jayachandran et al. | 710/19 |
| 2009/0204853 A1 | 8/2009 | Diggs et al. | |
| 2010/0061152 A1* | 3/2010 | De Caro et al. | 365/185.18 |
| 2010/0174849 A1 | 7/2010 | Walston et al. | |
| 2010/0250793 A1 | 9/2010 | Syu | |
| 2011/0099323 A1 | 4/2011 | Syu | |

(56) References Cited

U.S. PATENT DOCUMENTS

| | | |
|---|---|---|
| 2011/0191526 A1 | 8/2011 | Haukness et al. |
| 2011/0283049 A1 | 11/2011 | Kang et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

OTHER PUBLICATIONS

U.S. Appl. No. 12/326,780 to Mark S. Diggs, et al., filed Dec. 2, 2008.
U.S. Appl. No. 12/350,180 to Wesley Walston, et al., filed Jan. 7, 2009.
Second Office Action dated Jun. 26, 2014 from Chinese Patent Application No. 201010134420.0 filed Feb. 24, 2014 and English Translation, 8 pages.
Office Action dated Oct. 12, 2011 from U.S. Appl. No. 12/350,180, 22 pages.
Office Action dated Mar. 20, 2012 from U.S. Appl. No. 12/326,780, 33 pages.
Office Action dated Jun. 1, 2012 from U.S. Appl. No. 12/350,180, 22 pages.
Office Action dated Nov. 5, 2012 from U.S. Appl. No. 12/350,180, 11 pages.
Office Action dated Nov. 30, 2012 from U.S. Appl. No. 12/326,780, 46 pages.
Advisory Action dated May 22, 2013 from U.S. Appl. No. 12/326,780, 11 pages.
Office Action dated Oct. 8, 2013 from Chinese Patent Application No. 201010134420.0, filed Mar. 16, 2010, 16 pages.
Office Action dated Jan. 30, 2014 from U.S. Appl. No. 12/350,180, 20 pages.
Notice of Allowance dated Dec. 11, 2013 from U.S. Appl. No. 12/326,780, 15 pages.
Office Action dated Jul. 25, 2013 from Chinese Patent Application No. 201010134420.0 filed Jan. 7, 2010 and English translation of The State Intellectual Property Office of P.R.C. Search Report, 20 pages.
Office Action dated Apr. 15, 2014 from Chinese Patent Application No. 201010134420.0 filed Jan. 7, 2010 and English translation of The State Intellectual Property Office of P.R.C. Search Report, 13 pages.
Interview Summary dated Sep. 2, 2011 from U.S. Appl. No. 12/326,780, 3 pages.
Office Action dated Apr. 7, 2011 from U.S. Appl. No. 12/350,180, 22 pages.
Office Action dated May 25, 2011 from U.S. Appl. No. 12/326,780, 37 pgs.
Office Action dated Nov. 8, 2011 from U.S. Appl. No. 12/326,780, 39 pgs.
Notice of Allowance dated Apr. 25, 2014 from U.S. Appl. No. 12/326,780, 10 pgs.
Interview Summary dated Jun. 30, 2014 from U.S. Appl. No. 12/350,180, 3 pgs.
Interview Summary dated Dec. 24, 2014 from U.S. Appl. No. 12/350,180, 3 pgs.
Third Office Action dated Dec. 16, 2014 from Chinese Patent Application No. 201010002144.2, filed Jan. 7, 2010, 11 pages.
Notice of Allowance dated Jan. 13, 2015, from U.S. Appl. No. 12/350,180, 9 pgs.
Final Office Action dated Aug. 5, 2014 from U.S. Appl. No. 12/350,180, 17 pages.
Notice of Allowance dated Apr. 23, 2015 from U.S. Appl. No. 12/350,180, 26 pages.
Interview Summary dated Jan. 9, 2012 from U.S. Appl. No. 12/350,180, 3 pages.

* cited by examiner

ADJUSTING ACCESS OF NON-VOLATILE SEMICONDUCTOR MEMORY BASED ON ACCESS TIME

BACKGROUND

Description of the Related Art

A non-volatile semiconductor memory may be employed as mass storage for a computer system (e.g., desktop, laptop, portable, etc.) or a consumer device (e.g., music player, cell phone, camera, etc.) or other suitable application. The non-volatile semiconductor memory may comprise one or more memory devices (such as a flash memory) and control circuitry for accessing each memory device. Each memory device is coupled to an address bus and a data bus, as well as a number of interface control lines. When issuing a write command or an erase command to a memory device, the control circuitry configures the address bus and control lines, and then transfers command data (and user data for a write operation) over the data bus. After receiving the command, the memory device executes the command internally over an "access time". To determine when the memory device is finished executing the command, the control circuitry typically polls the memory device by issuing a "command status" request wherein the memory device transmits the contents of a command status register to the control circuitry.

Figure 1A:
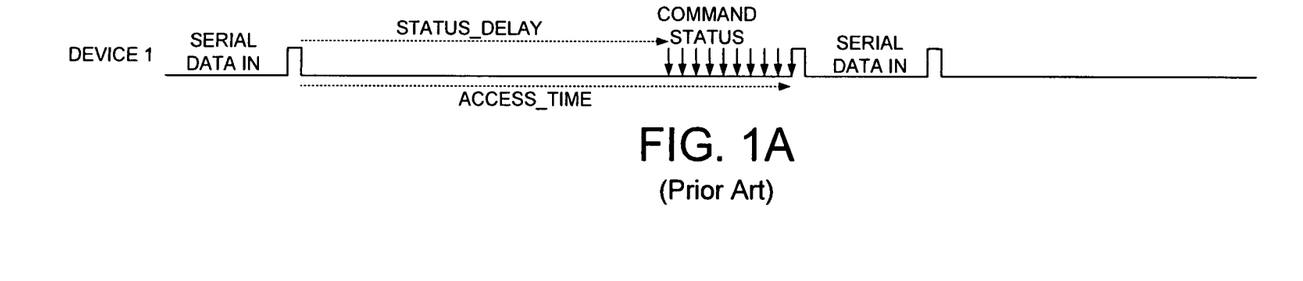
FIG. 1A illustrates a prior art access of a memory device wherein a status delay may be significantly shorter than the access time which increases the number of command status requests sent to the memory device.

FIG. 1A illustrates a problem with the prior art sequence for writing or erasing a memory device. The waveform of FIG. 1A represents the ready/busy line of the memory device. After transferring (serial data in) the command data (and user data for a write operation), the control circuitry delays for a predetermined time (STATUS_DELAY) and then begins polling the memory device for the command status register. When the command status register indicates the previous command has completed successfully, the control circuitry may transmit a next command to the memory device. Depending on the speed of the particular memory device, the status delay time (STATUS_DELAY) may be significantly shorter than the actual access time, and therefore the control circuitry may begin polling for the status command register well before the memory device has finished processing the command. This may be undesirable since excessive polling for the status command register consumes power in battery operated host devices.

Figure 1B:
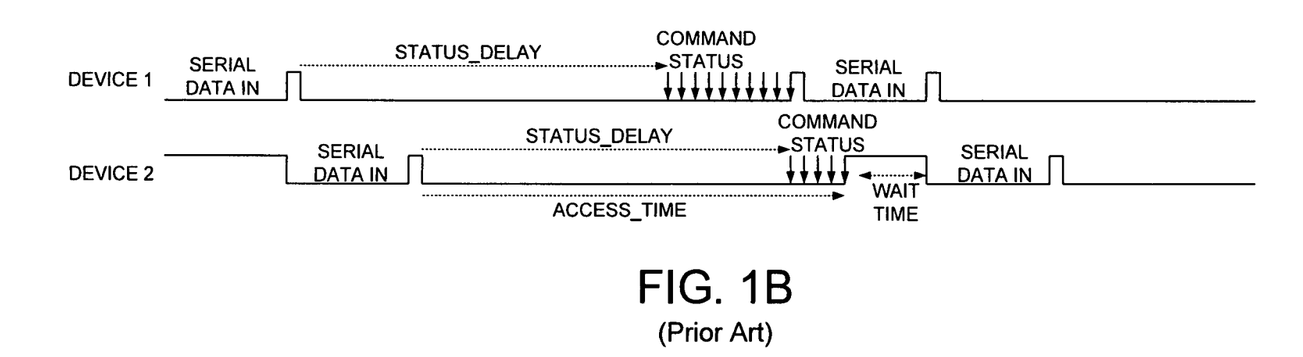
FIG. 1B illustrates a prior art access of two memory devices over a shared bus wherein a collision may occur due to the different access times of the memory devices.

FIG. 1B illustrates another problem with the prior art sequence when writing to a first and second memory device over single channel. In the example shown in FIG. 1B, the second memory device has a shorter access time than the first memory device. After transmitting command data to the first memory device, command data is immediately transmitted to the second memory device during the access time of the first memory device. When the command status register of the first memory device indicates the command has completed successfully, a next command is transmitted to the first memory device. However, while transferring the next command to the first memory device, the second memory device may also be ready to receive a next command but must wait for the control circuitry to finish transmitting the next command to the first memory device (i.e., there is a collision in accessing the shared bus). This WAIT TIME shown in FIG. 1B is undesirable because it reduces the overall performance (throughput) of the non-volatile semiconductor memory.

DETAILED DESCRIPTION OF EMBODIMENTS OF THE INVENTION

Figures 2A, 2B:
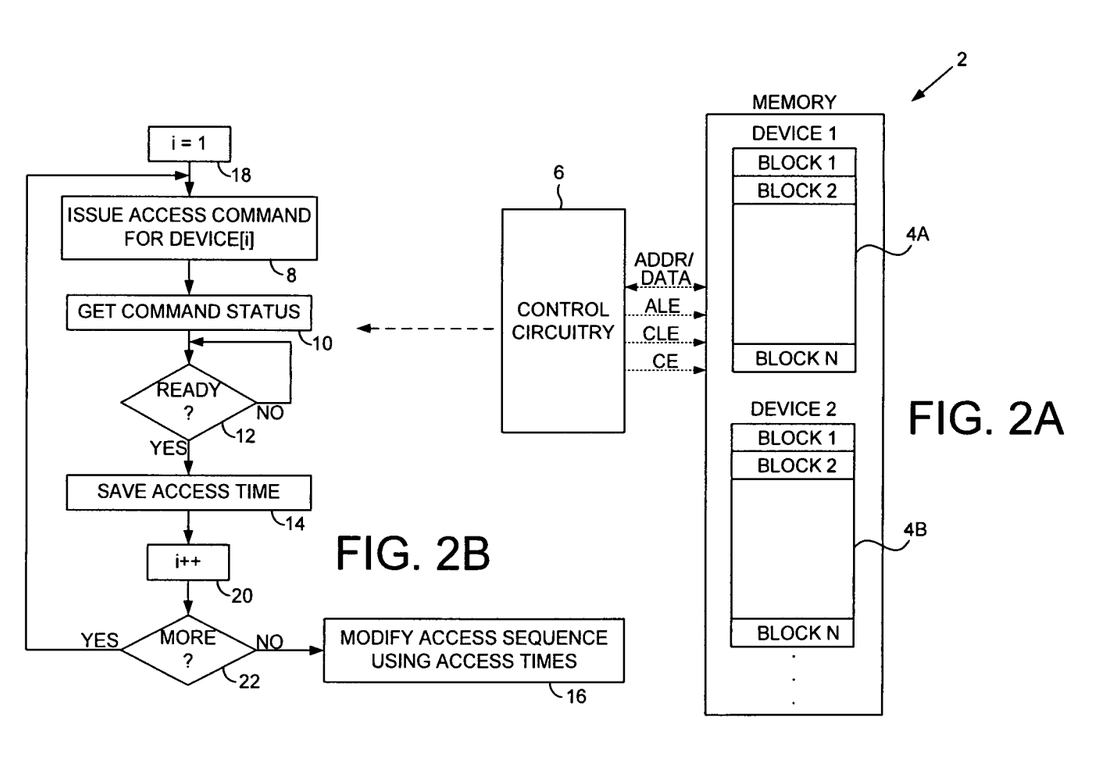
FIG. 2A shows a non-volatile semiconductor memory according to an embodiment of the present invention comprising a first and second memory device accessed by control circuitry.
FIG. 2B is a flow diagram executed by the control circuitry according to an embodiment of the present invention wherein the access time of the memory devices is measured in order to modify an access sequence of the memory devices.

FIG. 2A shows a non-volatile semiconductor memory 2 according to an embodiment of the present invention comprising a first memory device 4A and control circuitry 6 operable to execute the flow diagram shown in FIG. 2B. An access command is issued to the first memory device (step 8). A command status is requested from the first memory device after a status delay (step 10). When the command status indicates the first memory device has completed the command (step 12), a first access time of the memory device is measured (step 14). An access sequence of the first memory device is then modified in response to the access time (step 16).

The memory device 4A in the embodiment of FIG. 2A may comprise any suitable device, such as a NAND flash memory. A typical NAND flash memory is accessed by transmitting a corresponding address and transmitting/receiving data over an address/data bus (ADDR/DATA), and asserting appropriate control lines (e.g., address latch enable (ALE), command latch enable (CLE), chip enable (CE), etc.). In the embodiment of FIG. 2A, the non-volatile semiconductor memory 2 comprises multiple memory devices (e.g., 4A, and 4B) which are accessed by the control circuitry 6 by transmitting the appropriate address over the address/data bus (which may be a parallel or serial bus). In one embodiment, the control circuitry 6 measures the access time of each memory device in FIG. 2B by initializing a counter (step 18) which is incremented (step 20) until the access time of all of the memory devices has been measured (step 22).

Figure 3A:
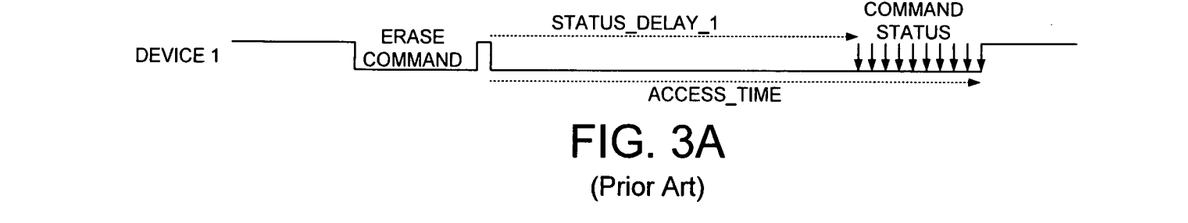
FIG. 3A shows a prior art erase operation of a memory device wherein a status delay is significantly shorter than the access time which increases the number of command status requests sent to the memory device.
Figure 3B:
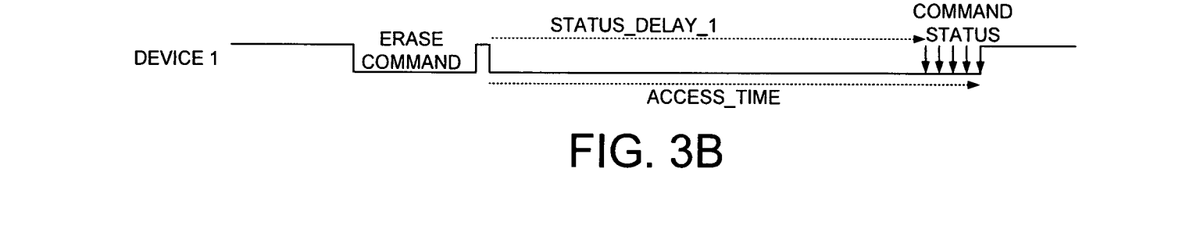
FIG. 3B illustrates an embodiment of the present invention wherein the access sequence of the memory devices is modified by adjusting the status delay in response to the measured access times, thereby reducing the number of command status requests sent to the memory devices.

FIG. 3A shows a prior art erase operation of a memory device wherein after transmitting an erase command, the control circuitry waits for a nominal status delay and then begins polling the memory device by requesting a command status from the memory device. However, the nominal status delay may be significantly shorter than the actual access time of the memory device, and therefore the control circuitry may begin polling for the command status sooner than needed resulting in undesirable power dissipation. In an embodiment of the present invention shown in FIG. 3B, the control circuitry measures the access time of the memory device and then modifies the access sequence of the memory device by adjusting the status delay in response to the access time. In this manner, the control circuitry begins polling for the command status at a more optimal time, which reduces power consumption by reducing the number of requests for the command status as illustrated in FIG. 3B.

In one embodiment, the access time needed to perform an erase command is different from the access time needed to perform a write command. Accordingly, in one embodiment the status delay is optimized relative to different types of access commands (e.g., a status delay optimized for erase commands and a status delay optimized for write commands).

Figure 3C:
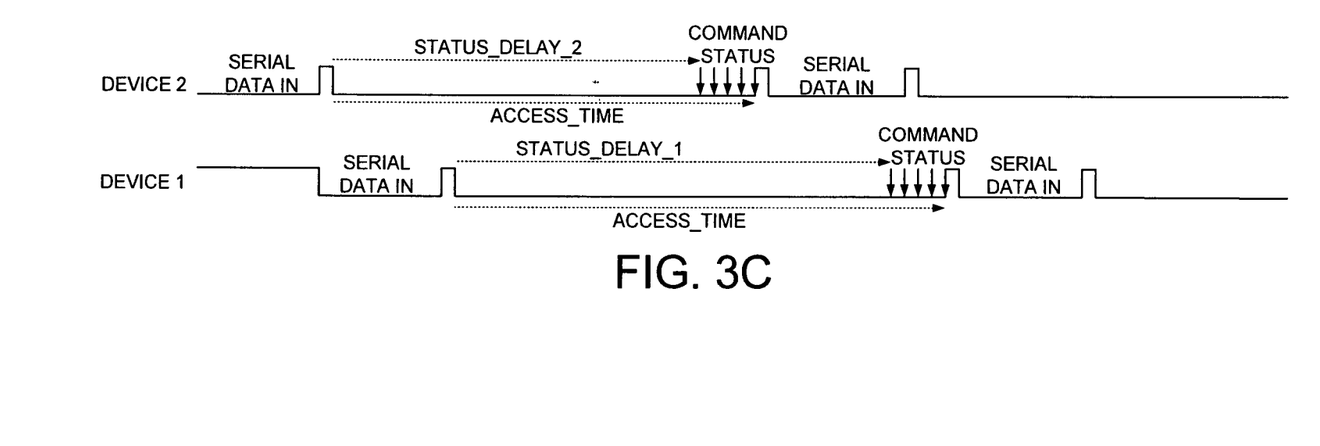
FIG. 3C illustrates an embodiment of the present invention wherein the access sequence of the memory devices is modified by modifying an order in which commands are transmitted to the memory devices, thereby improving performance by reducing or avoiding wait times due to collisions.

FIG. 3C shows an embodiment of the present invention wherein the access sequence of the memory devices is modified by selecting an order in which write commands are transmitted in response to the access times. For example, in one embodiment data is written to the memory devices using a "striping" technique so as to optimize performance. The data blocks of a write command are stored sequentially, one block at a time to each of the selected memory devices in a particular order. In this manner, the access times of each memory devices can overlap while concurrently processing the write commands rather than storing each block sequentially to an individual memory device which would require the control circuitry to wait for the access time of the memory device before transmitting the next data block.

In the example of FIG. 3C, the second memory device has a shorter access time than the first memory device, and therefore a first write command and corresponding data block is transmitted to the second memory device. During the access time of the second memory device, the control circuitry transmits a second write command and corresponding data block to the first memory device. When the second memory device is finished processing the first write command, it can immediately receive a new write command from the control circuitry 6. Similarly, when the first memory device is finished processing the second write command, it can immediately receive a new write command from the control circuitry. Accordingly, this embodiment may reduce or eliminate the wait time shown in the prior art order of FIG. 1B by reducing or avoiding collisions when attempting to access two or more of the memory devices over the shared bus at the same time.

Figure 4:
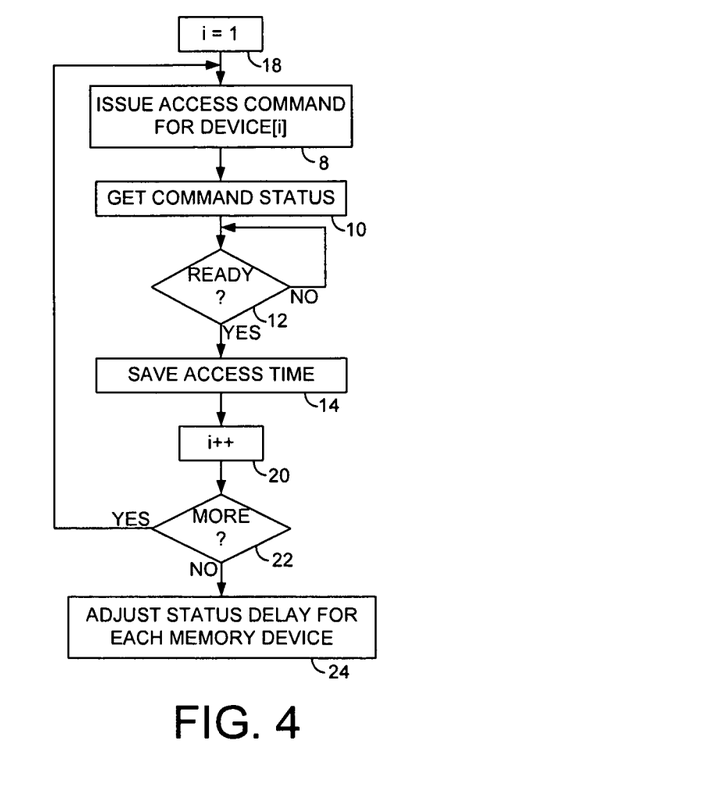
FIG. 4 is a flow diagram according to an embodiment of the present invention wherein the access sequence of the memory devices is modified by adjusting the status delay in response to the measured access times.
Figure 5:
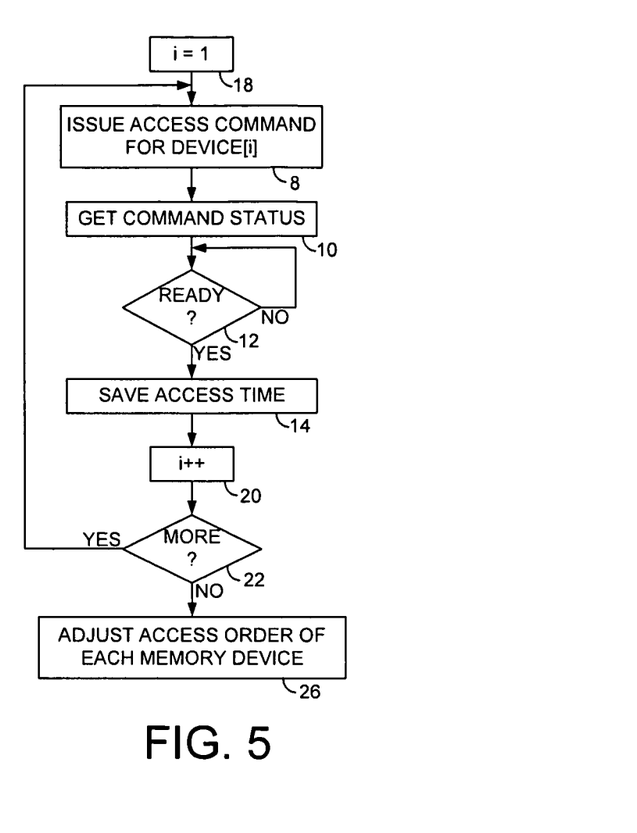
FIG. 5 is a flow diagram according to an embodiment of the present invention wherein the access sequence of the memory devices is modified by modifying an order in which commands are transmitted to the memory devices.

FIG. 4 is a flow diagram according to an embodiment of the present invention which extends on the flow diagram of FIG. 2B, wherein the step of modifying the access sequence of the memory device (step 16 of FIG. 2B) comprises adjusting the status delay for the memory device (step 24) as illustrated in FIG. 3B. FIG. 5 is a flow diagram according to an embodiment of the present invention which extends on the flow diagram of FIG. 2B, wherein the step of modifying the access sequence of the memory device (step 16 of FIG. 2B) comprises modifying an order in which commands are transmitted to the memory device (step 26) as illustrated in FIG. 3C.

Figure 6A:
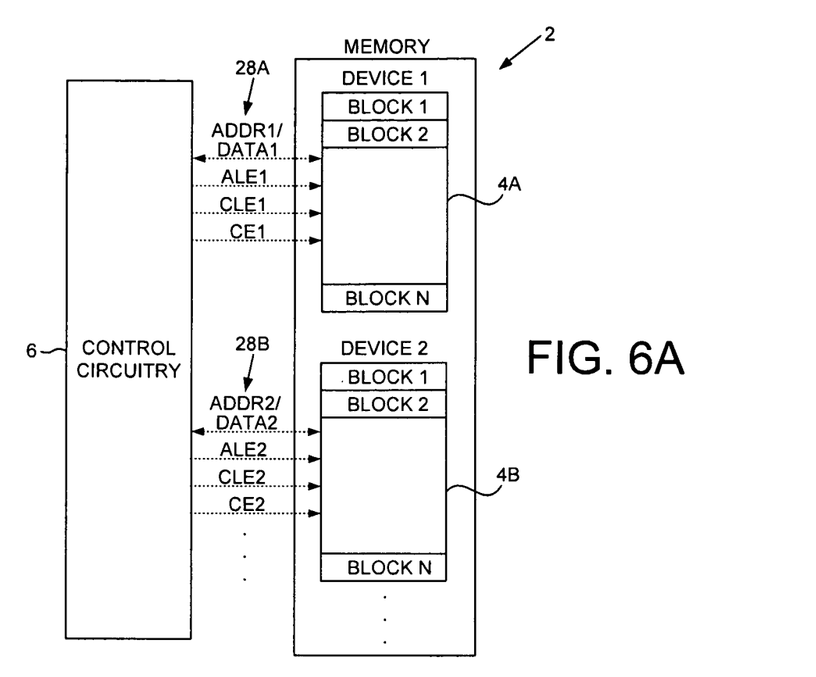
FIG. 6A shows an embodiment of the present invention wherein the control circuitry accesses each memory device over a separate, dedicated bus.

FIG. 6A shows a non-volatile semiconductor memory 2 according an embodiment of the present invention wherein the control circuitry 6 accesses each memory device (e.g., 4A and 4B) over separate, dedicated buses 28A and 28B. In this embodiment it's unnecessary to order the transmitted commands relative to the access times since there is never a collision attempting to simultaneously access a shared bus. However, this embodiment still benefits from optimizing the status delay in order to minimize the number of requests for the command status as illustrated in FIG. 3B.

Figure 6B:
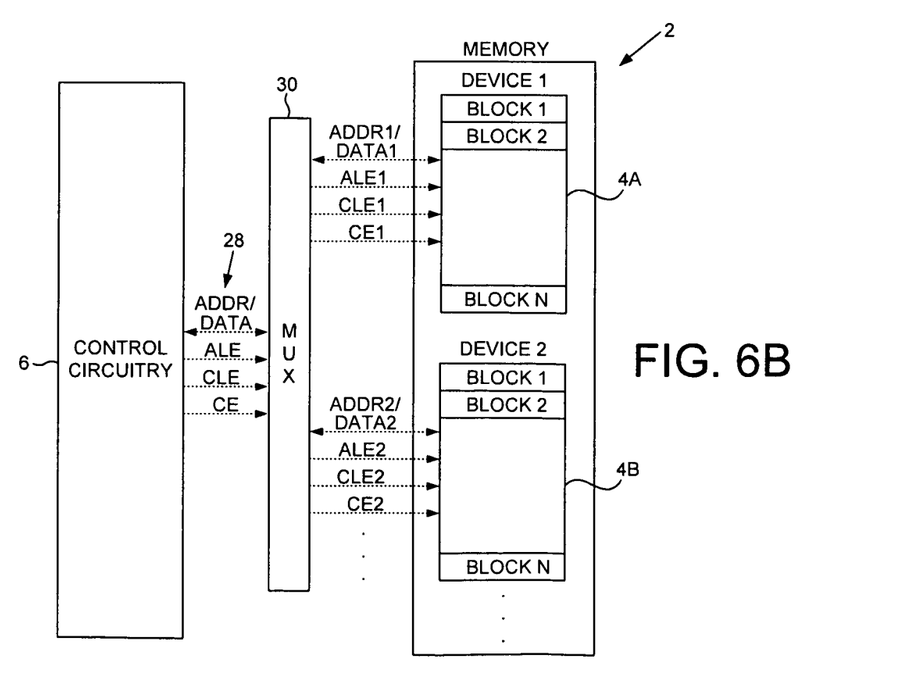
FIG. 6B shows an embodiment of the present invention wherein the control circuitry accesses each memory device over a shared bus.

FIG. 6B shows a non-volatile semiconductor memory 2 according an embodiment of the present invention wherein the control circuitry 6 accesses each memory device (e.g., 4A and 4B) over a shared bus 28. Sharing the bus 28 is illustrated conceptually in FIG. 6B as configuring a multiplexer 30 to access a desired memory device. However, sharing the bus may be implemented in any suitable manner, such as a wired-OR implementation with dedicated chip enable (CE) lines that enable the desired memory device being accessed. This embodiment benefits both from optimizing the status delay to reduce the number of command status requests, as well as ordering the transmitted commands relative to the access times in order to reduce or avoid collisions.

The process of measuring the access times of each memory device and modifying the access sequence may be performed at any suitable time. In one embodiment, the access times are measured and the access sequence modified during a manufacturing procedure of the non-volatile semiconductor memory. In other embodiments, the access times may vary over the lifetime of the non-volatile semiconductor memory 2 and/or affected by environmental conditions, such as temperature. Therefore, in one embodiment the access times may be measured whenever the non-volatile semiconductor memory is powered on, or measured periodically over the lifetime of the non-volatile semiconductor memory, or measured in response to detected changes in environmental conditions, or measured in response to a command received from a host system.

The non-volatile semiconductor memory 2 of the present invention may be employed in any suitable application, such as in a solid state disk drive (SSD), or in a memory card or memory stick. In addition, the non-volatile semiconductor memory 2 may employ any suitable memory devices 4A and 4B that may exhibit different access times (e.g., different access times for erase commands and/or for write commands).

What is claimed is:

1. A non-volatile semiconductor memory comprising a first memory device, a second memory device, and control circuitry operable to:

measure a first access time of the first memory device following issuance of a first access command to the first memory device;

measure a second access time of the second memory device following issuance of a second access command to the second memory device, wherein the second access command is issued after the first access command according to an access order of the first and second memory devices, wherein the access order defines a sequence of accessing the first and second memory devices for consecutive access commands;
modify the access order of the first and second memory devices for subsequent consecutive access commands based on the measured first and second access times; and
set a delay period of the subsequent consecutive access command associated with the first memory device, wherein the delay period is based on the first access time and indicates when a polling for a status of the subsequent consecutive access command begins after the subsequent consecutive access command is issued.

2. The non-volatile semiconductor memory as recited in claim 1, wherein the control circuitry is further operable to access the first and second memory devices over a shared bus.

3. The non-volatile semiconductor memory as recited in claim 2, wherein the control circuitry is further operable to modify the access order of the first and second memory devices for subsequent access commands by modifying an order in which the control circuitry transmits access commands to the first and second memory devices over the shared bus.

4. The non-volatile semiconductor memory as recited in claim 3, wherein the control circuitry is further operable to:
first select one of the first and second memory devices in response to the first and second access times;
transmit a third access command to the first selected memory device;
second select a different one of the first and second memory devices in response to the first and second access times; and
after transmitting the third access command to the first selected memory device and during an access time associated with the first selected memory device for the third access command, transmit a fourth access command to the second selected memory device.

5. The non-volatile semiconductor memory as recited in claim 4, wherein the access time of the first selected memory device is less than the access time of the second selected memory device.

6. A method of operating a non-volatile semiconductor memory comprising a first memory device and a second memory device, the method comprising:
issuing an access command to the first memory device;
requesting a command status from the first memory device after a status delay;
when the command status indicates the first memory device has completed the access command, measuring a first access time of the first memory device;
measuring a second access time of the second memory device;
modifying, based on the first and second access times, an order in which subsequent access commands are issued to the first and second memory devices such that the first memory device is before the second memory device in the order if the first access time is less than the second access time and the second memory device is before the first memory device in the order if the second access time is less than the first access time, wherein the order defines a sequence of accessing the first and second memory devices for consecutive access commands; and
setting a delay period of the subsequent consecutive access command associated with the first memory device, wherein the delay period is based on the first access time and indicates when a polling for a status of the subsequent consecutive access command begins after the subsequent consecutive access command is issued.

7. The method as recited in claim 6, further comprising accessing the first and second memory devices over a shared bus.

8. The method as recited in claim 7, further comprising modifying the order in which the subsequent access commands are issued to the first and second memory devices by modifying an order in which commands are transmitted to the first and second memory devices over the shared bus.

9. The method as recited in claim 8, further comprising:
first selecting one of the first and second memory devices in response to the first and second access times;
transmitting a third access command to the first selected memory device;
second selecting a different one of the first and second memory devices in response to the first and second access times; and
after transmitting the third access command to the first selected memory device and during an access time associated with the first selected memory device for the third access command, transmitting a fourth access command to the second selected memory device.

10. The method as recited in claim 9, wherein the access time of the first selected memory device is less than the access time of the second selected memory device.

11. The non-volatile semiconductor memory as recited in claim 1, wherein modifying the access order further comprises:
modify the access order such that the first memory device is before the second memory device if the first access time is less than the second access time; and
modify the access order such that the second memory device is before the first memory device if the second access time is less than the first access time.

12. A method comprising:
determining a first access sequence for a first memory device and a second memory device, wherein the first memory device is before the second memory device in the first access sequence;
determining a first access time of the first memory device;
determining a second access time of the second memory device;
determining that the second access time is less than the first access time; modifying, in response to determining the second access time is less than the first access time, the first access sequence to a second access sequence, wherein the second memory device is before the first memory device in the second access sequence, and the second access sequence defines a sequence of accessing the first and second memory devices for consecutive access commands; and
setting a delay period of the consecutive access command associated with the first memory device, wherein the delay period is based on the first access time and indicates when a polling for a status of the consecutive access command begins after the consecutive access command is issued.

* * * * *